US012701992B2

(12) United States Patent
Sugioka et al.

(10) Patent No.: US 12,701,992 B2
(45) Date of Patent: Aug. 4, 2026

(54) APPARATUSES INCLUDING METAL-INSULATOR-METAL CAPACITOR AND METHODS FOR FORMING SAME

(71) Applicant: MICRON TECHNOLOGY, INC., Boise, ID (US)

(72) Inventors: Shigeru Sugioka, Higashihiroshima (JP); Hidenori Yamaguchi, Higashihiroshima (JP); Keizo Kawakita, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 843 days.

(21) Appl. No.: 17/691,725

(22) Filed: Mar. 10, 2022

(65) Prior Publication Data

US 2023/0290720 A1    Sep. 14, 2023

(51) Int. Cl.
| | |
|---|---|
| *H10D 1/00* | (2025.01) |
| *H10D 1/68* | (2025.01) |
| *H10W 20/00* | (2026.01) |
| *H10W 20/40* | (2026.01) |
| *H10P 50/00* | (2026.01) |
| *H10P 50/28* | (2026.01) |

(52) U.S. Cl.
CPC .......... *H10W 20/496* (2026.01); *H10D 1/042* (2025.01); *H10D 1/716* (2025.01); *H10W 20/081* (2026.01); *H10P 50/283* (2026.01); *H10P 50/73* (2026.01)

(58) Field of Classification Search
CPC .......... H10D 1/68; H10D 1/692; H10D 1/711; H10D 1/716; H01L 23/5223; H01L 28/40; H01L 28/60; H01L 28/82; H01L 28/90
See application file for complete search history.

(56) References Cited

U.S. PATENT DOCUMENTS

| | | | |
|---|---|---|---|
| 2003/0100156 A1* | 5/2003 | Mori ..................... | H10B 12/033 257/E21.018 |
| 2016/0218172 A1* | 7/2016 | Hsieh ...................... | H01L 28/90 |
| 2022/0013555 A1* | 1/2022 | Krueger ........... | H01L 27/14665 |
| 2022/0199759 A1* | 6/2022 | Chyi Liu .......... | H01L 21/76831 |

OTHER PUBLICATIONS

Silane; P-4649-G [Online]; Praxair: Danbury, CT; Jan. 7, 2025. (Year: 2025).*

* cited by examiner

*Primary Examiner* — Reema Patel
(74) *Attorney, Agent, or Firm* — Dorsey & Whitney LLP

(57) ABSTRACT

A semiconductor structure includes an opening formed in a surface of an insulating layer, and a lower metal layer on the surface of the insulating layer, and sidewalls and a bottom surface of the opening in the surface of the insulating layer. The sidewalls are tapered inwardly from the surface of the insulating layer to the bottom surface of the opening by a taper angle of between 10 degrees and 45 degrees.

15 Claims, 8 Drawing Sheets

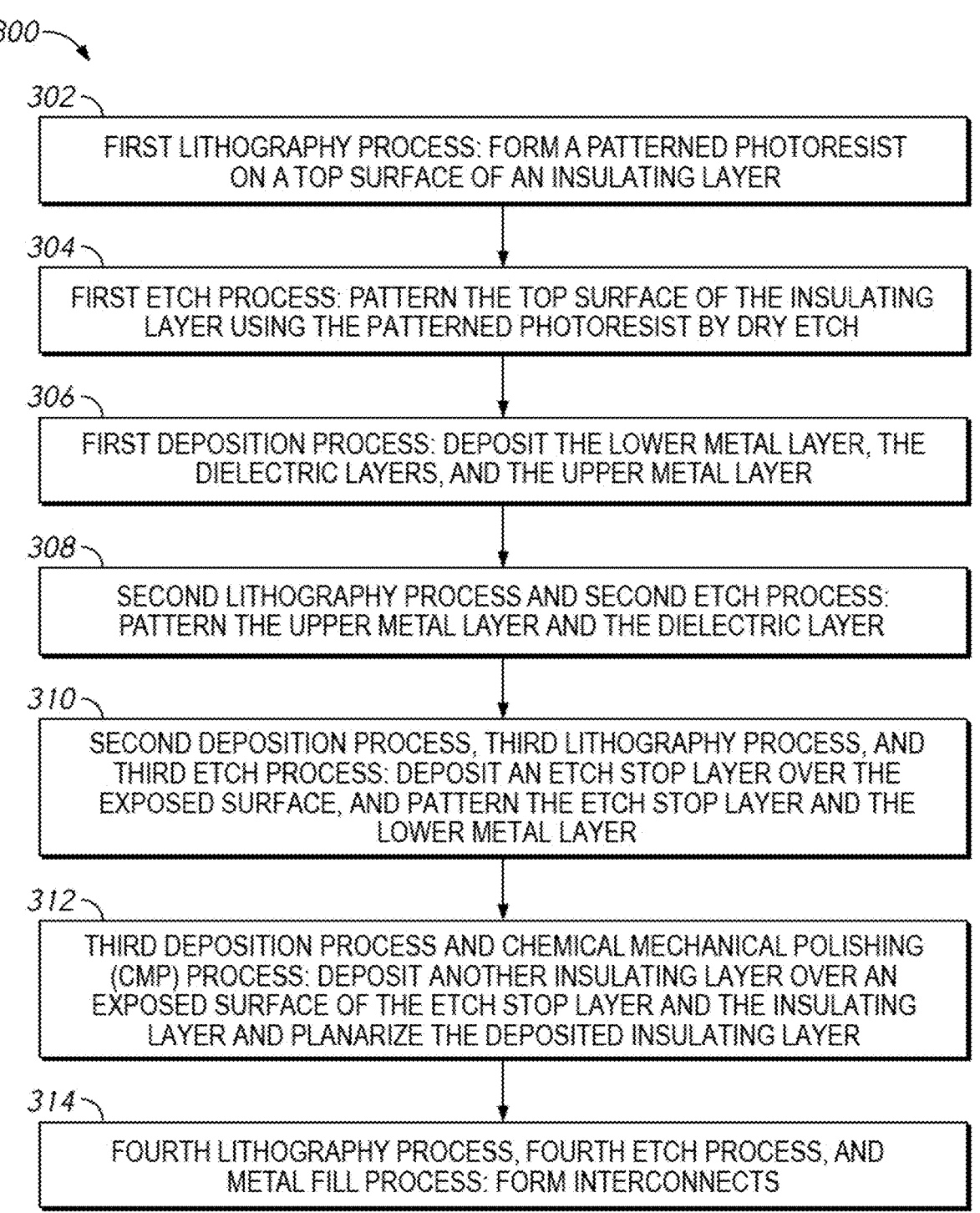

*300*

302
FIRST LITHOGRAPHY PROCESS: FORM A PATTERNED PHOTORESIST ON A TOP SURFACE OF AN INSULATING LAYER

304
FIRST ETCH PROCESS: PATTERN THE TOP SURFACE OF THE INSULATING LAYER USING THE PATTERNED PHOTORESIST BY DRY ETCH

306
FIRST DEPOSITION PROCESS: DEPOSIT THE LOWER METAL LAYER, THE DIELECTRIC LAYERS, AND THE UPPER METAL LAYER

308
SECOND LITHOGRAPHY PROCESS AND SECOND ETCH PROCESS: PATTERN THE UPPER METAL LAYER AND THE DIELECTRIC LAYER

310
SECOND DEPOSITION PROCESS, THIRD LITHOGRAPHY PROCESS, AND THIRD ETCH PROCESS: DEPOSIT AN ETCH STOP LAYER OVER THE EXPOSED SURFACE, AND PATTERN THE ETCH STOP LAYER AND THE LOWER METAL LAYER

312
THIRD DEPOSITION PROCESS AND CHEMICAL MECHANICAL POLISHING (CMP) PROCESS: DEPOSIT ANOTHER INSULATING LAYER OVER AN EXPOSED SURFACE OF THE ETCH STOP LAYER AND THE INSULATING LAYER AND PLANARIZE THE DEPOSITED INSULATING LAYER

314
FOURTH LITHOGRAPHY PROCESS, FOURTH ETCH PROCESS, AND METAL FILL PROCESS: FORM INTERCONNECTS

*FIG. 3*

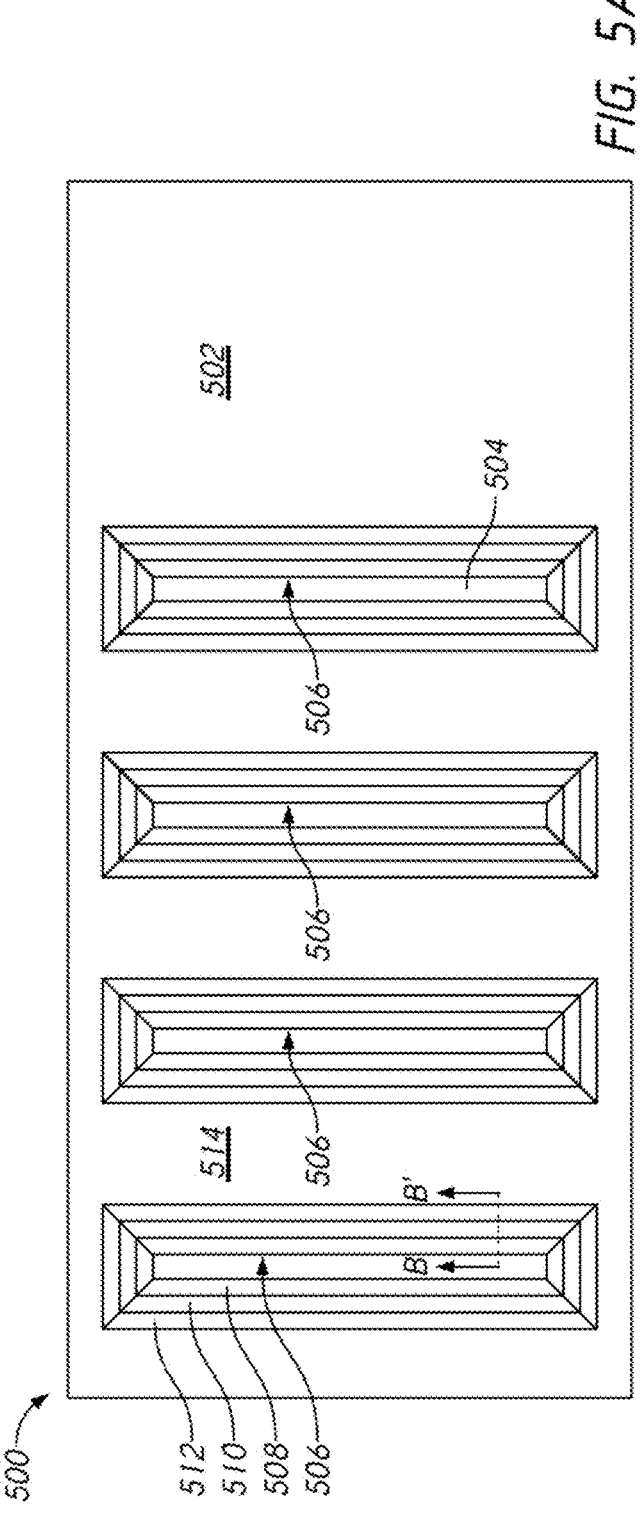
FIG. 5A
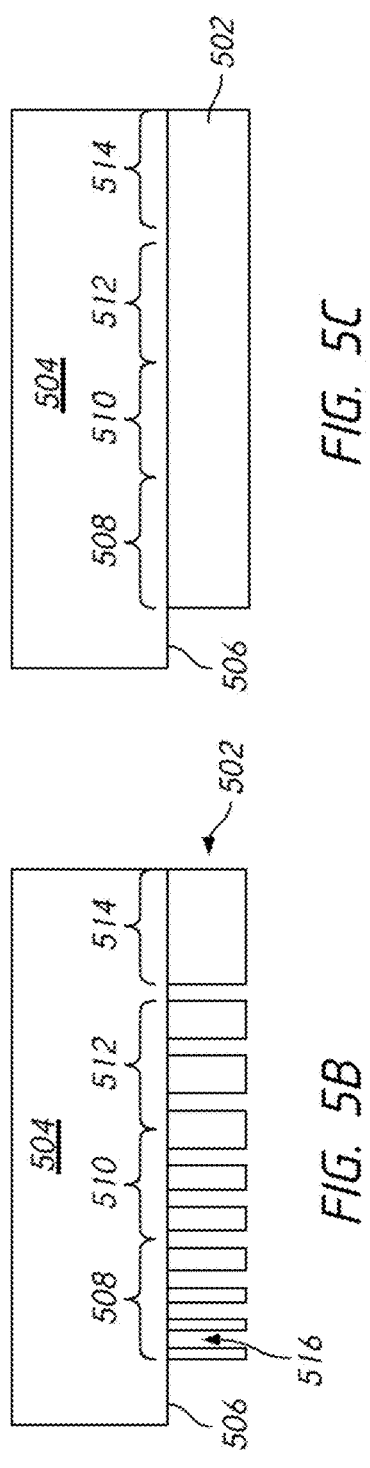
FIG. 5B
FIG. 5C

APPARATUSES INCLUDING METAL-INSULATOR-METAL CAPACITOR AND METHODS FOR FORMING SAME

BACKGROUND

In large-scale integrated (LSI) circuits, metal-insulator-metal (MIM) capacitors are integrated into back-end-of-the-line (BEOL) metallization stack between the last two metal layers close to the power lines to reduce high-frequency noise. As operating frequency keeps increasing and technology nodes continue scaling, high capacitance MIM capacitors are needed while retaining low leakage and long reliability lifetime.

To increase capacitance, MIM capacitors have been formed in trenches such that the MIM capacitors have a larger surface area, and thus a higher capacitance, as compared to planar MIM capacitors. However, in the fabrication of such MIM capacitors, a metal electrode layer of an MIM capacitor deposited over the trenches may have reduced thickness at sharp edges of the trenches. A dielectric layer and another metal electrode layer that are deposited over the metal electrode layer to form a capacitor may also have reduced thickness at the edges of the trenches. This reduction in the thickness of the dielectric layer of this capacitor increases the leakage current and deteriorates the reliability of the device, causes device failures, decreases yield, and increases manufacturing cost to increase leakage current.

Therefore, there is a need for MIM capacitors in which each layer has a large surface area and a uniform thickness and methods for forming the same.

BRIEF DESCRIPTION OF THE DRAWINGS

FIG. 3 is a process flow diagram for forming a semiconductor structure according to an embodiment of the disclosure.

FIG. 5A is a top view of a photomask having an absorber layer with a one-dimensional pattern formed on a transparent substrate according to an embodiment of the disclosure.

FIGS. 5B and 5C are cross-sectional views of a portion of the photomask along the line B-B' depicted in FIG. 5A.

Figure 1:
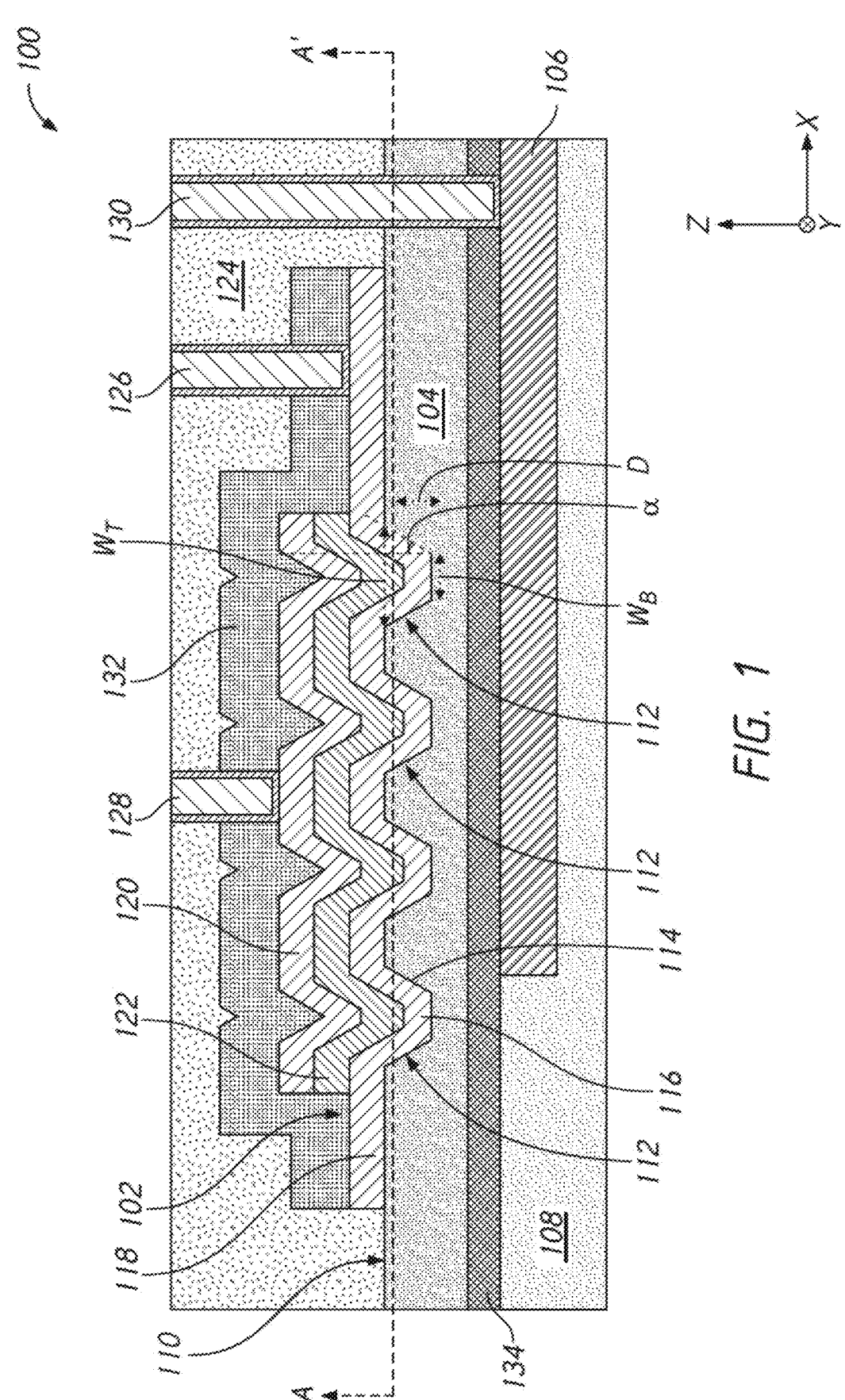
FIG. 1 is a cross-sectional view of a semiconductor structure according to an embodiment of the disclosure.

To facilitate understanding, identical reference numerals have been used, where possible, to designate identical elements that are common to the figures. In the figures and the following description, an orthogonal coordinate system including an X-axis, a Y-axis, and a Z-axis is used. The directions represented by the arrows in the drawing are assumed to be positive directions for convenience. It is contemplated that elements disclosed in some embodiments may be beneficially utilized on other implementations without specific recitation.

DETAILED DESCRIPTION

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with ordinary skill in the art so as not to obscure the description of embodiments of the disclosure. The following detailed description is therefore not to be taken in a limiting sense, and the scope of the disclosure is defined only by the appended claims.

The embodiments described herein provide MIM capacitors that are formed in openings in underlying layers, where each of the openings have sidewalls that are tapered from a top surface of the underlying layers towards a bottom surface of the opening. Such MIM capacitors may have higher capacitance as compared to planer-type MIM capacitors since a surface area of the MIM capacitors is increased. Further, due to the tapered sidewalls of the openings. MIM capacitors can be formed conformally in the openings since there are no sharp edges of the openings.

FIG. 1 is a cross-sectional view of a semiconductor structure 100 according to an embodiment of the disclosure. The semiconductor structure 100 includes a metal-insulator-metal (MIM) capacitor 102 formed on an insulating layer 104. In some embodiments of the disclosure, the MIM capacitor 102 may be formed within the back-end-of-line (BEOL) portion of a semiconductor device where interconnects are formed to connect individual devices, such as transistors, capacitors, and resistors. The BEOL portion is formed on a topmost metal interconnect layer 106 encapsulated within an underlying insulating layer 108 in the front-end-of-line (FEOL) portion of the semiconductor device. The FEOL portion is sealed by the insulating layer 104 that may be formed of silane ($SiH_4$) or tetraethoxysilane ($Si(OC_2H_5)_4$, TEOS). The metal interconnect layer 106 may be formed of metal such as copper (Cu). The underlying insulating layer 108 may be formed of material having a dielectric constant lower than that of silicon oxide ($SiO_2$).

On a top surface 110 of the insulating layer 104, one or more openings 112 each having sidewalls 114 and a bottom surface 116 are formed. The MIM capacitor 102 includes a lower metal layer 118, an upper metal layer 120, and a dielectric layer 122 that is disposed between the lower metal layer 118 and the upper metal layer 120. The lower metal layer 118 is formed conformally over the top surface 110 of the insulating layer 104, and the sidewalls 114 and the bottom surface 116 of each of the opening 112, continuously covering portions of the top surface 110 of the insulating layer 104, and the sidewalls 114 and the bottom surface 116 of each of the opening 112. The dielectric layer 122 continuously covers the lower metal layer 118. The upper metal layer 120 continuously covers the dielectric layer 122. The sidewalls 114 of each opening 112 are inwardly tapered from the top surface 110 of the insulating layer 104 towards the bottom surface 116 of the opening 112. That is, a width $W_B$ of the opening 112 at the bottom surface 116 is narrower than a width $W_T$ of the opening 112 at the top surface 110 of the insulating layer 104, and a taper angle α is defined as $\tan^{-1}(W_T-W_B)/2D$, where D is a depth of the opening 112. In the embodiments described herein, the taper angle α is between 10 degrees and 45 degrees. It should be noted that although four openings 112 are depicted in the example shown in FIG. 1, the number of openings 112 may be less than four or more than four. It should be also noted that the lower metal layer 118, the upper metal layer 120, and the dielectric layer 122 have each a substantially uniform thickness over the top surface 110 of the insulating layer 104 and within the openings 112 since the openings 112 have no sharp edges due to the tapered sidewalls 114, and thus the MIM capacitor 102 can be made with a reliable value of a capacitance.

The lower metal layer 118 may be formed of titanium nitride (TiN) or tantalum nitride (TaN). The upper metal layer 120 may be formed of titanium (Ti), titanium nitride (TiN), tantalum (Ta), tantalum nitride (TaN), or any combination thereof. The dielectric layer 122 may be formed of material having a high dielectric constant, such as hafnium (Hf)-containing high-k material, zirconium (Zr)-containing high-k material, aluminum (Al)-containing high-k material, or any combination thereof. In some embodiments, the dielectric layer 122 may be formed of the same material as that used in storage capacitors in the FEOL portion in a dynamic random-access memory (DRAM) device.

In some embodiments, the lower metal layer 118 and the upper metal layer 120 are electrically connected to an overlying metal interconnect layer (not shown) that is separated from the MIM capacitor 102 by an insulating layer 124, via an interconnect 126 and an interconnect 128, respectively. The interconnects 126 and 128 are formed through the insulating layer 124. The overlying metal interconnect layer is electrically connected to the underlying metal interconnect layer 106 via an interconnect 130 that is formed through the insulating layer 124 and the insulating layer 104. An etch stop film 132 may be formed between the insulating layer 124 and the MIM capacitor 102, and an etch stop film 134 may be formed between the insulating layer 104 and the underlying insulating layer 108. The insulating layer 124 may be formed of silicon-containing oxide, such as silicon oxide ($SiO_2$). The etch stop films 132, 134 may be formed of silicon carbide (SiC)-containing material. The interconnects 126, 128, and 130 may include barrier metal, such as titanium nitride (TiN) and tungsten nitride (WN), and tungsten (W) formed on the barrier metal. The barrier metal and the tungsten (W) on the surface of the insulator layer 124 may be removed by a chemical mechanical polishing (CMP) process.

Figure 2A:
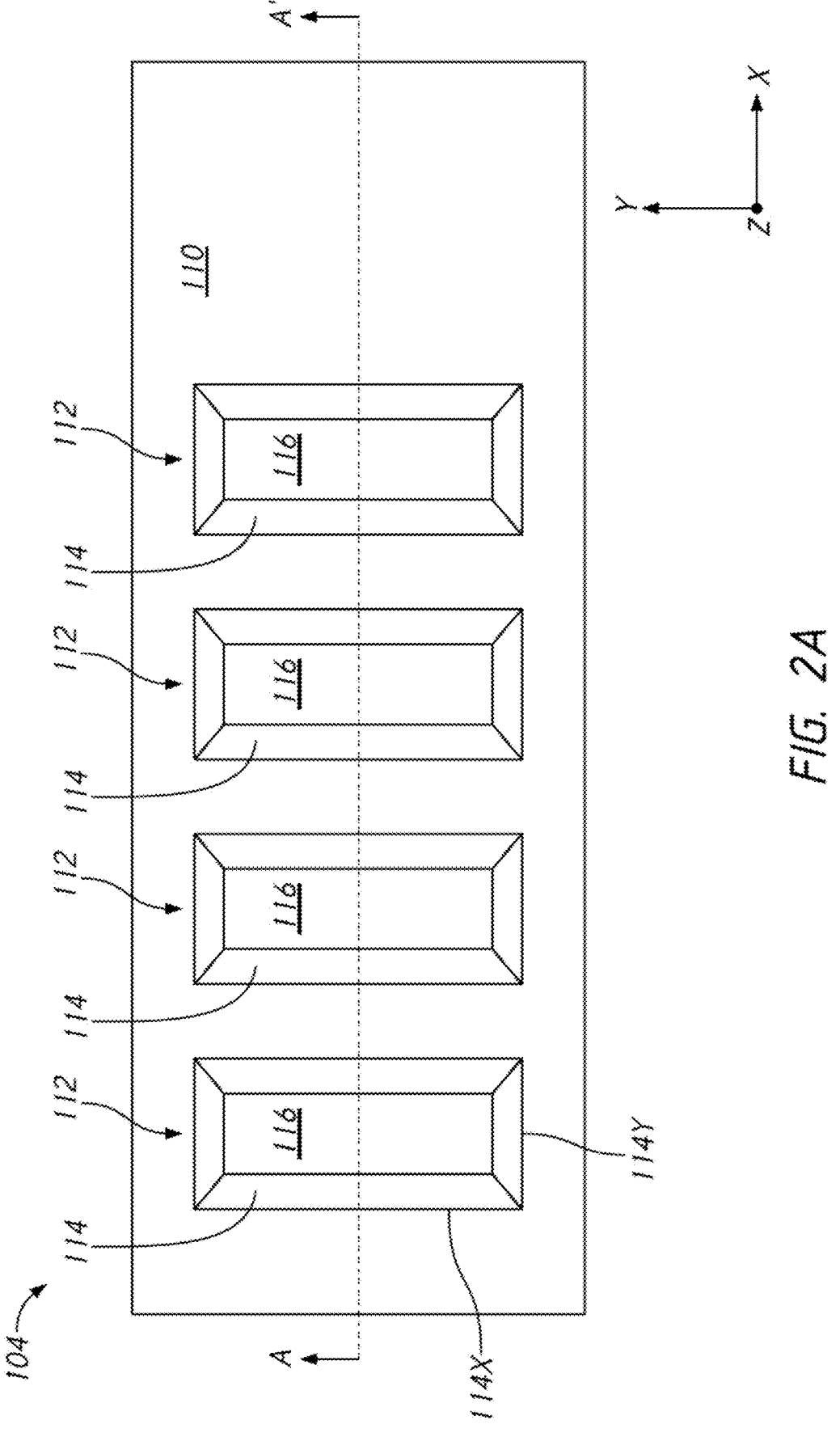
FIG. 2A is a top view of a top surface of an insulating layer in the semiconductor structure along the line A-A' depicted in FIG. 1, according to an embodiment of the disclosure.

FIG. 2A is a top view of the top surface 110 of the insulating layer 104 along the line A-A' depicted in FIG. 1, according to an embodiment of the disclosure. The openings 112 are arranged in a one-dimensional array in the X-direction, and each opening 112 extends in the Y-direction. Portions 114X of the sidewalls 114 on edges of each opening 112 in the X-direction are tapered inwardly from the top surface 110 of the insulating layer 104 towards the bottom surface 116 in the X-direction. As shown in FIG. 1, the taper angle α of the sidewalls 114 is between 10 degrees and 45 degrees. Portions 114Y of the sidewalls 114 on edges of each opening 112 in the Y-direction are tapered inwardly from the top surface 110 of the insulating layer 104 towards the bottom surface 116 in the Y-direction, with a taper angle α of between 10 degrees and 45 degrees.

Figure 2B:
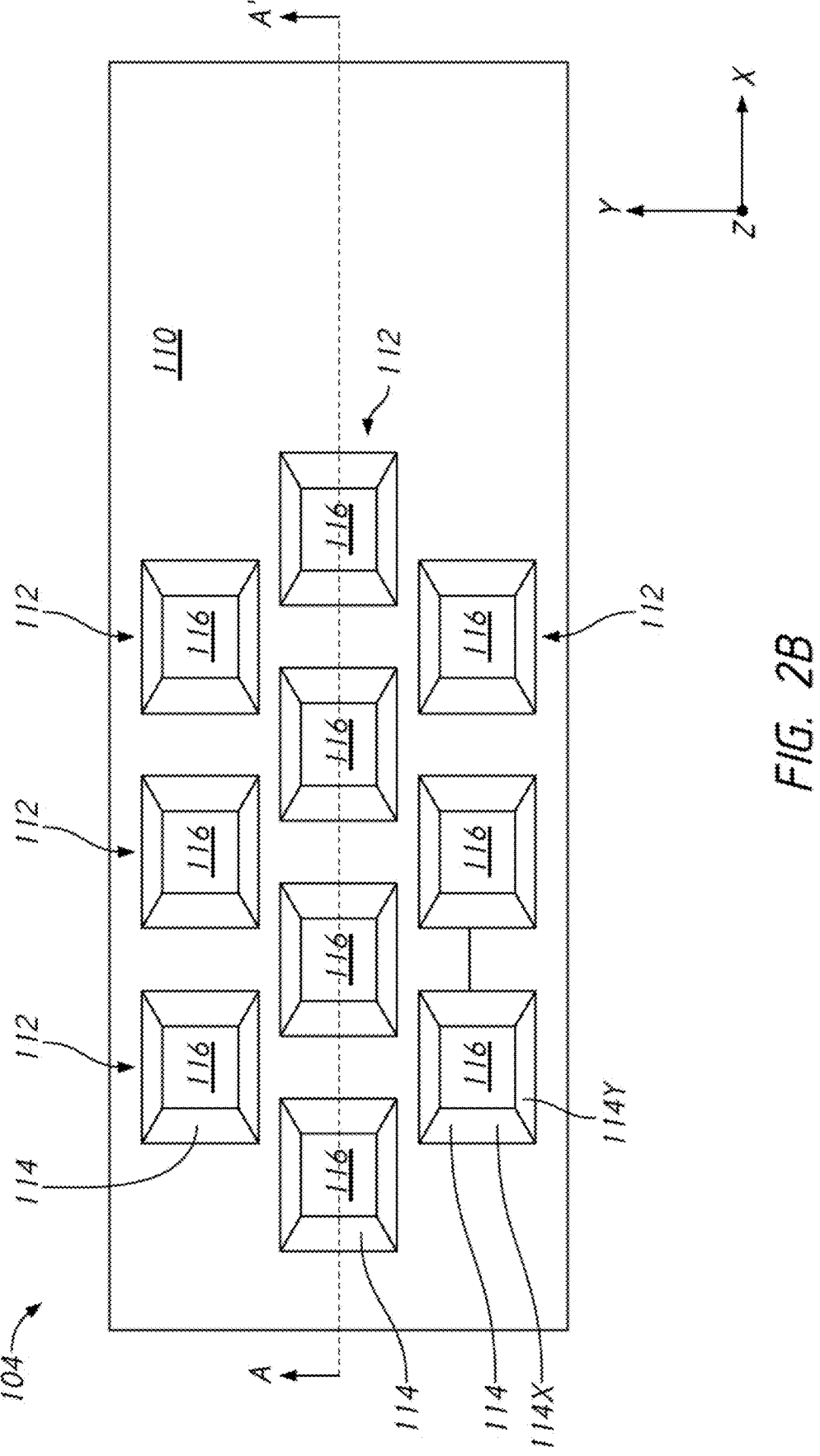
FIG. 2B is a top view of a top surface of an insulating layer in the semiconductor structure along the line A-A' depicted in FIG. 1, according to another embodiment of the disclosure.

FIG. 2B is a top view of the top surface 110 of the insulating layer 104 along the line A-A' depicted in FIG. 1, according to another embodiment. The openings 112 are arranged in a two-dimensional array in the X-Y directions. Portions 114X of the sidewalls 114 on edges of each openings 112 in the X-direction are tapered inwardly from the top surface 110 of the insulating layer 104 towards the bottom surface 116 in the X-direction. As shown in FIG. 1, the taper angle α of the sidewalls 114 is between 10 degrees and 45 degrees. Portions 114Y of the sidewalls 114 on edges of each opening 112 in the Y-direction are tapered inwardly from the top surface 110 of the insulating layer 104 towards the bottom surface 116 in the Y-direction, with a taper angle α of between 10 degrees and 45 degrees.

FIG. 3 is a process flow diagram of a method 300 of forming a semiconductor structure, such as the semiconductor structure 100, according to certain embodiments. FIGS. 4A, 4B, 4C, 4D, 4E, 4F, and 4G are cross-sectional views of a portion of the semiconductor structure 100 corresponding to various states of the method 300. It should be understood that FIGS. 4A, 4B, 4C, 4D, 4E, 4F, and 4G illustrate only partial schematic views of the semiconductor structure 100, and the semiconductor structure 100 may contain any number of transistor sections and additional materials having aspects as illustrated in the figures. It should also be noted although the method steps illustrated in FIG. 3 are described sequentially, other process sequences that include one or more method steps that have been omitted and/or added, and/or has been rearranged in another desirable order, fall within the scope of the embodiments of the present disclosure.

Figures 4A, 4B, 4C, 4D:
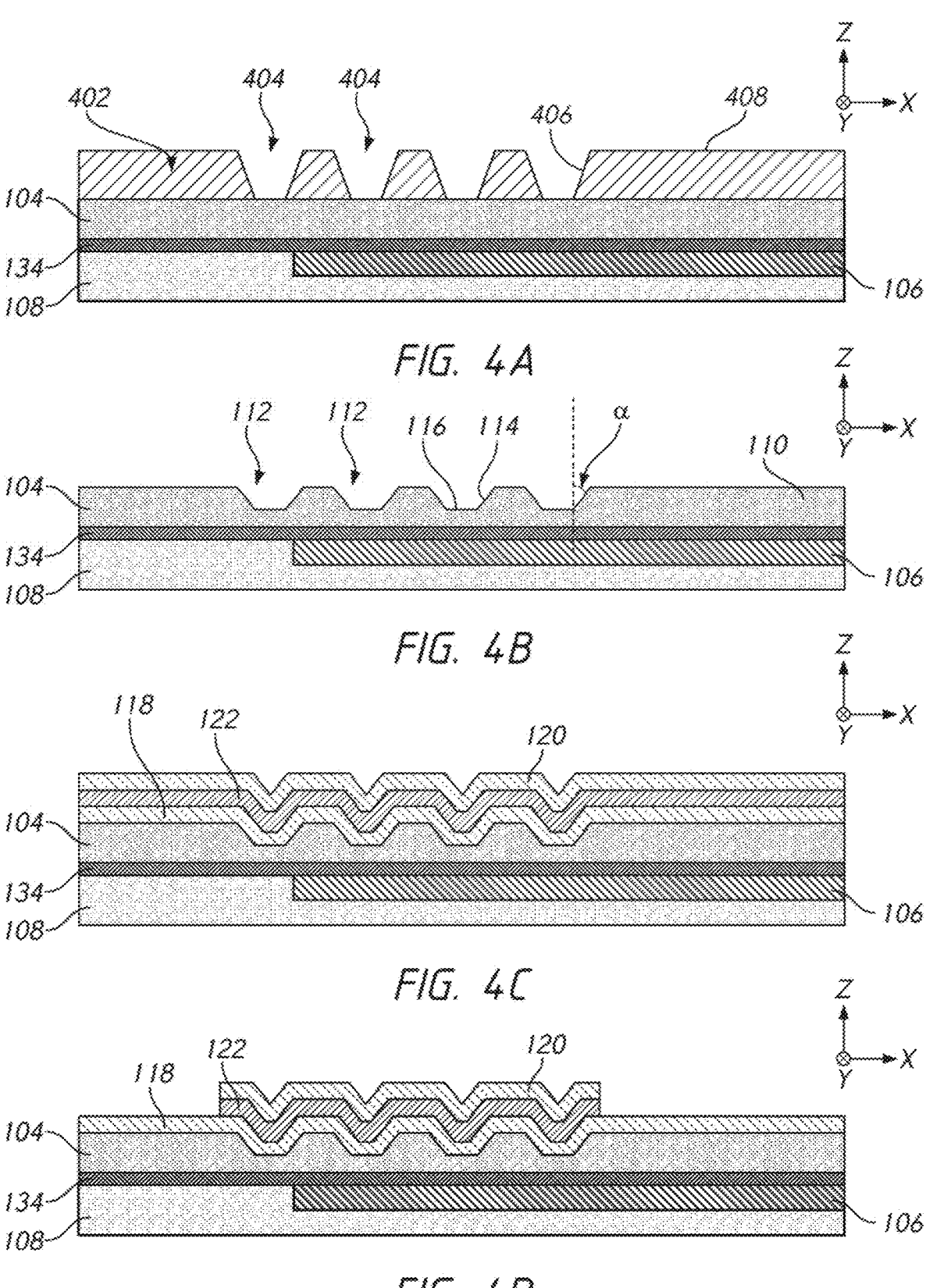
FIGS. 4A, 4B, 4C, 4D, 4E, 4F, and 4G are cross-sectional views of a portion of a semiconductor structure corresponding to various states of FIG. 3.

The method 300 begins with block 302, in which a first lithography process is performed to form a patterned photoresist 402 on a top surface 110 of an insulating layer 104, as shown in FIG. 4A. The insulating layer 104 is formed over an underlying insulating layer 108 that encapsulates an underlying metal interconnect layer 106. An etch stop film 134 may be formed between the underlying insulating layer 108 and the insulating layer 104. The insulating layer 104 may be formed of silane ($SiH_4$) or tetraethoxysilane (Si($OC_2H_5$)$_4$, TEOS). The metal interconnect layer 106 may be formed of metal such as copper (Cu). The underlying insulating layer 108 may be formed of material having a dielectric constant lower than that of silicon oxide ($SiO_2$). The etch stop film 134 may be formed of silicon carbide (SiC)-containing material.

The patterned photoresist 402 has openings 404. Sidewalls 406 of each opening 404 are formed tapered inwardly from a top surface 408 of the photoresist 402 towards the top surface 110 of the insulating layer 104. The first lithography process includes coating the top surface 110 of the insulating layer 104 with a positive photoresist (i.e., a photo-sensitive material that becomes soluble to a photoresist developer when exposed to light), applying a patterned photomask (also referred to as a "reticle") on the positive photoresist, exposing the positive photoresist to light through the patterned photomask, and applying a developer to dissolve light-exposed portions of the positive photoresist. In some embodiments, the photomask has a one-dimensional pattern as in a photomask 500 depicted in FIGS. 5A, 5B, and 5C. In the first lithography process using the photomask having a one-dimensional pattern, the patterned photoresist 402 having openings 404 arranged in a one-dimensional array is formed. In some other embodiments, the photomask has a two-dimensional pattern as in a photomask 600 depicted in FIG. 6. In the first lithography process using the photomask having a two-dimensional pattern, the patterned photoresist 402 having openings 404 arranged in two-dimensional array is formed. The photomask having a one-dimensional or a two-dimensional pattern is described in details in reference to FIGS. 5A, 5B, 5C, and 6 below. It should be noted that the first lithography process can be performed with a negative photoresist (i.e., a photo-sensitive material that becomes insoluble to a photoresist developer when exposed to light) by modifying the patterned photomask.

In block 304, a first etch process is performed to pattern the top surface 110 of the insulating layer 104 using the patterned photoresist 402, as shown in FIG. 4B. In the first etch process, openings 112 are formed in the top surface 110 of the insulating layer 104. Sidewalls 114 of each opening 112 are formed tapered inwardly from the top surface 110 of the insulating layer 104 towards the bottom surface 116 of the opening 112, with a taper angle $\alpha$ of between 10 degrees and 45 degrees. The first etch process can be any appropriate dry etch process, such as reactive-ion etching. In the dry etch process, the top surface 110 of the insulating layer 104 and the patterned photoresist 402 formed thereon are exposed to a bombardment of ions (e.g., plasma of reactive gases) that removes exposed portions of the insulating layer 104 and portions of the patterned photoresist 402 thereon. Initially, portions of the insulating layer 104 that are exposed from the patterned photoresist 402 are removed, and subsequently portions of the insulating layer 104 that are covered by the patterned photoresist 402 are removed after portions of the photoresist 402 thereon are removed. Thus, a shape of the formed openings 112 in the top surface 110 of the insulating layer 104 substantially contours a shape of the opening 404 of the patterned photoresist 402 formed thereon. In the first etch process using the patterned photoresist 402 having openings 404 arranged in a one-dimensional array, openings 112 arranged in a one-dimensional array are formed in the top surface 110 of the insulating layer 104. In the first etch process using the patterned photoresist 402 having openings 404 arranged in a two-dimensional array, openings 112 arranged in a two-dimensional array are formed in the top surface 110 of the insulating layer 104. Subsequent to the first etch process, the remaining photoresist 402 is stripped and the top surface 110 of the insulating layer 104 is cleaned by an appropriate wet etch process.

In block 306, a first deposition process is performed to deposit the lower metal layer 118 conformally on the top surface 110 of the insulating layer 104, the sidewalls 114 and the bottom surface 116 of the openings 112, the dielectric layer 122 conformally on the lower metal layer 118, and the upper metal layer 120 conformally on the dielectric layer 122, as shown in FIG. 4C. The first deposition process may be performed using any appropriate deposition process, such as chemical vapor deposition (CVD), sputtering, spin-on, physical vapor deposition (PVD), or the like. The lower metal layer 118 may be formed of titanium nitride (TiN) or tantalum nitride (TaN). The upper metal layer 120 may be formed of titanium (Ti), titanium nitride (TiN), tantalum (Ta), or tantalum nitride (TaN) or any combination thereof. The dielectric layer 122 may be formed of high-k dielectric material such as hafnium (Hf)-containing high-k material, zirconium (Zr)-containing high-k material, aluminum (Al)-containing high-k material, or any combination thereof. It should be noted that the deposited lower metal layer 118 may have a substantially uniform thickness over the top surface 110 of the insulating layer 104, and the tapered sidewalls 114 and the bottom surface 116 of each opening 112. It should also be noted use of such high-k dielectric material allows increased capacitance without leakage effect.

In block 308, a second lithography process and a second etch process are performed to pattern the upper metal layer 120 and the dielectric layer 122, as shown in FIG. 4D. The second lithography process is any appropriate lithography process forming a patterned photoresist on the upper metal layer 120. The second etch process can be any appropriate dry etch process, such as reactive-ion etching. In the dry etch process, portions of the upper metal layer 120 and the dielectric layer 122 that are exposed to a bombardment of ions are removed. Subsequent to the second etch process, the remaining photoresist is stripped and an exposed surface of the upper metal layer 120 and the lower metal layer 118 is cleaned by an appropriate wet etch process.

In the example depicted in FIG. 4D, portions of the upper metal layer 120 and the dielectric layer 122 below an overlying metal interconnect layer (not shown) are partially removed such that the overlying metal interconnect layer can be electrically connected to the lower metal layer 118. One or more lithography-etch processes may be performed to further pattern the upper metal layer 120, the dielectric layer 122, and the lower metal layer 118 to allow electrical connection between other pairs of metal interconnect layers.

Figure 4E:
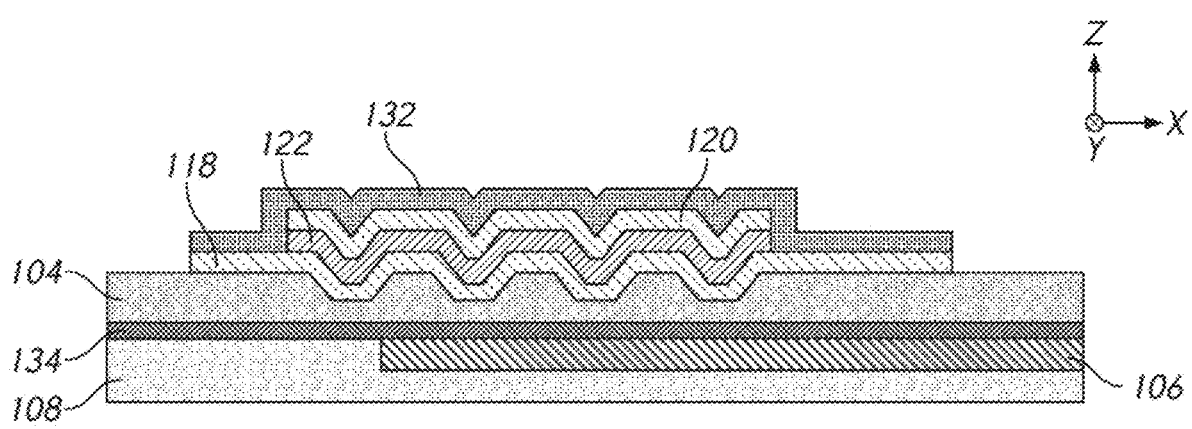

In block 310, a second deposition process, a third lithography process, and a third etch process are performed to deposit an etch stop film 132 over the exposed surface of the upper metal layer 120 and the lower metal layer 118, and pattern the etch stop film 132 and the lower metal layer 118, as shown in FIG. 4E. The second deposition process may be performed using any appropriate deposition process, such as chemical vapor deposition (CVD), sputtering, spin-on, physical vapor deposition (PVD), or the like. The third lithography process is any appropriate lithography process forming a patterned photoresist on the exposed surface of the upper metal layer 120 and the lower metal layer 118. The etch stop film 132 may be formed of silicon carbide (SiC)-containing material. The third etch process can be any appropriate dry etch process, such as reactive-ion etching. In the dry etch process, portions of the etch stop film 132 and the lower metal layer 118 that are exposed to a bombardment of ions are removed. Subsequent to the third etch process, the remaining photoresist is stripped and an exposed surface of the etch stop film 132 and the lower metal layer 118 is cleaned by an appropriate wet etch process.

Figure 4F:
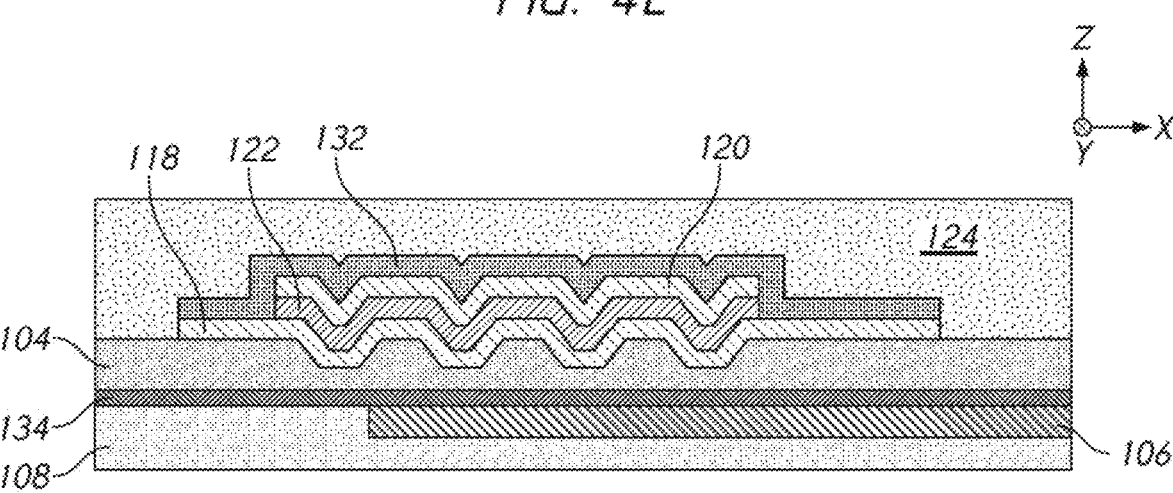

In block 312, a third deposition process and a CMP process are performed to deposit an insulating layer 124 over an exposed surface of the etch stop film 132 and the insulating layer 104 and planarize the deposited insulating layer 124, as shown in FIG. 4F. The second deposition process may be performed using any appropriate deposition process, such as chemical vapor deposition (CVD), sputtering, spin-on, physical vapor deposition (PVD), or the like. The insulating layer 124 may be formed of silicon-containing oxide, such as silicon oxide ($SiO_2$).

Figure 4G:
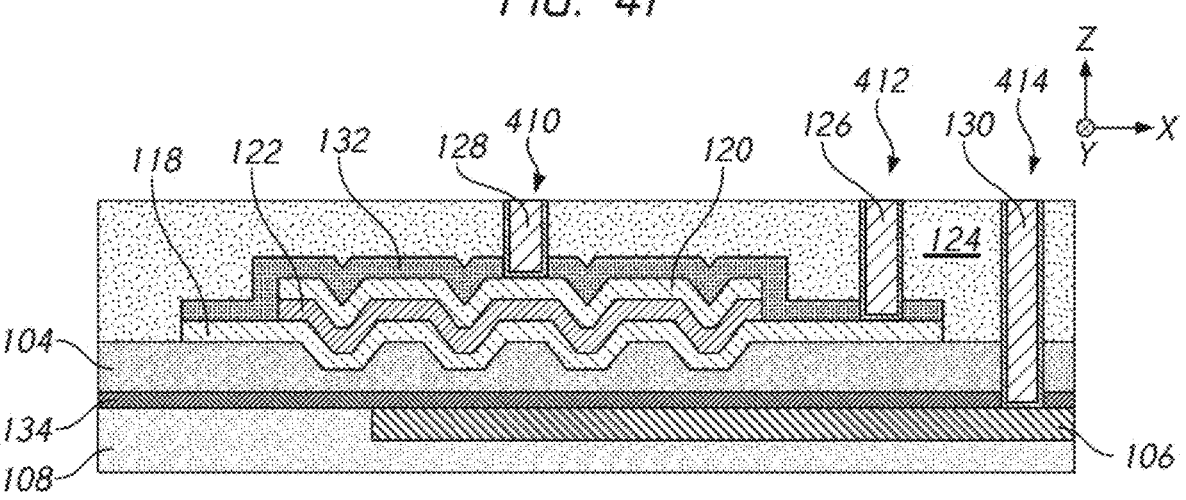

In block 314, a fourth lithography process, a fourth etch process, and a metal fill process are performed to form interconnects 126, 128, and 130, as shown in FIG. 4G. The fourth lithography process is any appropriate lithography process forming a patterned photoresist on the insulating layer 124. The fourth etch process can be any appropriate dry etch process, such as reactive-ion etching. In the dry etch process, a via 410 is formed through the insulating layer 124 to the etch stop film 132 to partially expose the upper metal layer 120, a via 412 is formed through the insulating layer 124 to the etch stop film 132 to partially expose the lower metal layer 118, and a via 414 is formed thorough the insulating layer 124 and the insulating layer 104 to the etch stop film 134 to partially expose the underlying metal interconnect layer 106. The metal fill process forms a metal barrier layer formed of barrier metal such as titanium nitride (TiN) and tungsten nitride (WN) within the vias 410, 412, and 414 and fills the vias 410, 412, and 414 with metal such as tungsten (W) to form the interconnects 128, 126, and 130, respectively. The barrier metal and the metal on the surfaces of the interconnects 126, 128, and 130 may be removed by a CMP process to flatten the surfaces of the interconnects 126, 128, and 130.

FIG. 5A is a top view of a photomask 500 having an absorber layer 502 with a one-dimensional pattern formed on a transparent substrate 504 according to one embodiment. FIG. 5B is a cross-sectional view of a portion of the photomask 500 along the line B-B' depicted in FIG. 5A according to an embodiment of the disclosure. FIG. 5C is a cross-sectional view of a portion of the photomask 500 along the line B-B' depicted in FIG. 5A according to another embodiment of the disclosure. The photomask 500 having one-dimensional pattern may be used in the first lithography process in block 302.

The transparent substrate 504 may be formed of glass or quartz. The absorber layer 502 may be formed of chromium (Cr)-containing material. The absorber layer 502 has openings 506 arranged in a one-dimensional array. The absorber layer 502 is formed such that light transmission of the photomask 500 decreases from the openings 506 towards portions away from the openings 506. That is, the photomask 500 is transparent within the openings 506, less transparent in a first portion 508 surrounding each opening 506. Light transmission of the photomask 500 further decreases in a second portion 510 surrounding the first portion 508, and even further in a third portion 512 surrounding the second portion 510. In a fourth portion 514 surrounding the third portion 512, the photomask 500 is opaque.

In the example depicted in FIG. 5B, the absorber layer 502 may be formed of chromium and have a grating structure. In each of the first portion 508, the second portion 510, and the third portion 512, the absorber layer 502 are patterned to forms slits 516. Line width of the absorber layer 502 between two adjacent slits 516 increases from the first portion 508 to the third portion 512, and the fourth portion 514 has no slits. Thus, light transmission of the photomask 500 decreases from the opening 506 (transparent) toward the fourth portion 514 (opaque).

In the example depicted in FIG. 5C, the absorber layer 502 may be formed of a "leaky" chromium material, such as chromium oxide ($Cr_2O_3$), chromium nitride (CrN), or chromium oxynitride (CrON), or any combination thereof. In the absorber layer 502, concentration of chromium is attenuated from the fourth portion 514 towards the opening 506, and thus light transmission of the photomask 500 decreases from the opening 506 (transparent) towards the fourth portion 514 (opaque).

In the examples described herein, the number of portions over which light transmission of the photomask 500 changes is four. However, light transmission of the photomask 500 may change over more than four or less than four separate portions of the photomask 500, or may change continuously over the photomask 500.

Figure 6:
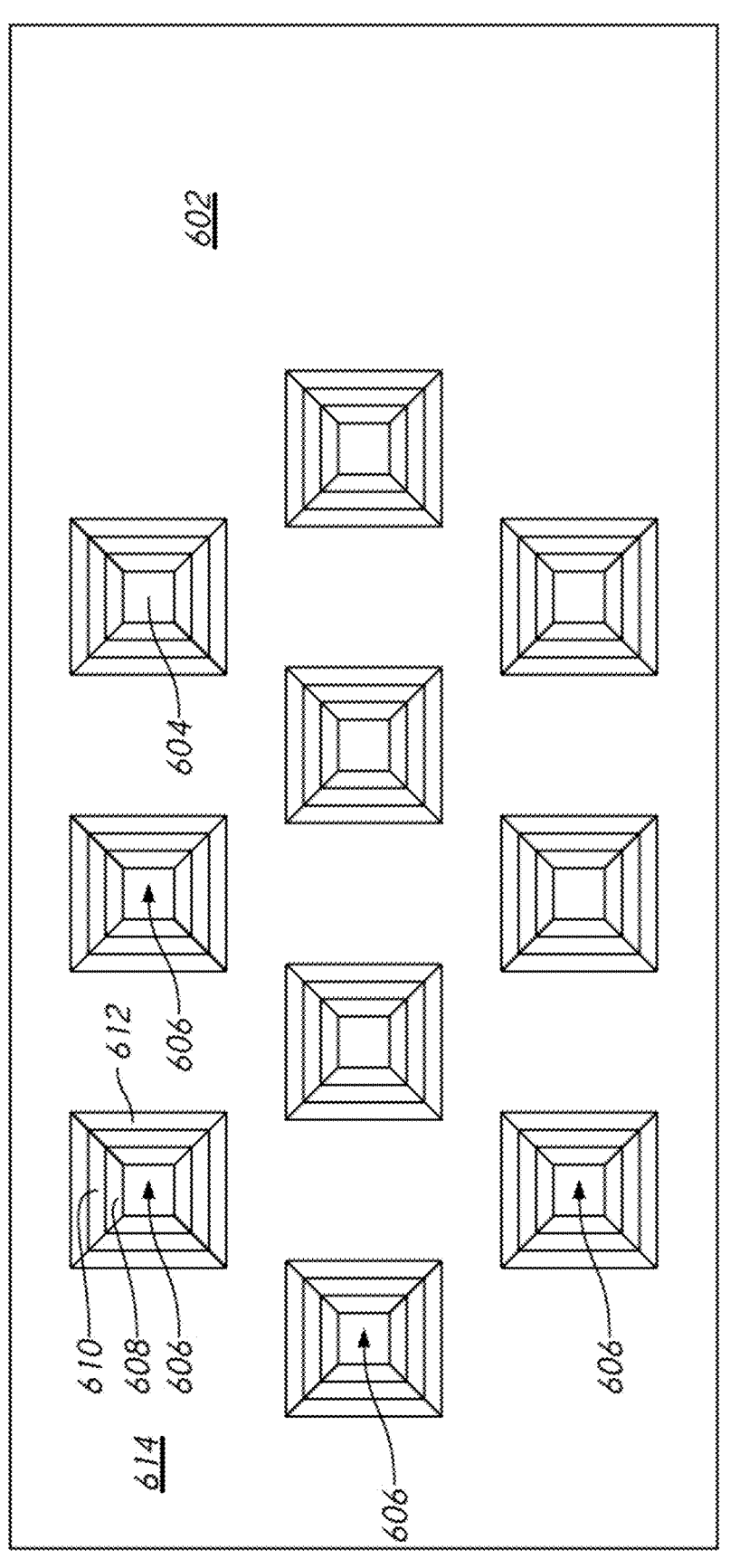
FIG. 6 is a top view of a photomask having an absorber layer with a two-dimensional pattern formed on a transparent substrate according to an embodiment of the disclosure.

FIG. 6 is a top view of a photomask 600 having an absorber layer 602 with a two-dimensional pattern formed on a transparent substrate 604 according to one embodiment.

The photomask 600 having a two-dimensional pattern may be used in the first lithography process in block 302.

The transparent substrate 604 may be formed of glass or quartz. The absorber layer 602 may be formed of chromium (Cr) containing material or opaque molybdenum silicide (MoSi) on glass (OMOG). The absorber layer 602 has openings 606 arranged in a two-dimensional array. The absorber layer 602 is formed such that light transmission of the photomask 600 decreases from the openings 606 towards portions away from the openings 606. That is, the photomask 600 is transparent within the openings 606, less transparent in a first portion 608 surrounding each opening 606. Light transmission of the photomask 600 further decreases in a second portion 610 surrounding the first portion 608, and even further in a third portion 612 surrounding the second portion 610. In a fourth portion 614 surrounding the third portion 612, the photomask 500 is opaque.

In some embodiments, the absorber layer 602 may be formed of chromium and have a grating structure similar to the absorber layer 502 depicted in FIG. 5B. In some other embodiments, similar to the absorber layer 502 depicted in FIG. 5C the absorber layer 602 may be formed of a "leaky" chromium material, such as chromium oxide ($Cr_2O_3$), chromium nitride (CrN), or chromium oxynitride (CrON), or any combination thereof, and concentration of chromium in the absorber layer 602 is attenuated from the fourth portion 614 towards the opening 606.

In the examples described herein, the number of portions over which light transmission of the photomask 600 changes is four. However, light transmission of the photomask 600 may change over more than four or less than four separate portions of the photomask 600, or may change continuously over the photomask 600.

In the embodiments described herein, MIM capacitors that can be integrated in integrated circuits and methods for forming the same are provided. An MIM capacitor described herein is formed in one or more openings in an underlying layer, and thus a surface area of a MIM capacitor can be increased as compared to a planer MIM capacitor, leading to a higher capacitance. Furthermore, each of the openings in the underlying layer has sidewalls that are tapered, and a metal layer of an MIM can be conformally formed over the edges of the openings. Such MIM capacitors may reduce device failures, increase yield, and decrease manufacturing cost.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:
1. A semiconductor structure, comprising:
an opening in a surface of a first insulating layer; and
a capacitor including:
    a lower metal layer on the surface of the first insulating layer, and sidewalls and a bottom surface of the opening, wherein the sidewalls are tapered inwardly from the surface of the first insulating layer to the bottom surface of the opening by a taper angle of between 10 degrees and 45 degrees;
    a dielectric layer on the lower metal layer;
    an upper metal layer on the dielectric layer; and an etch stop film on the upper metal layer and the lower metal layer, wherein the etch stop film contacts the upper metal layer and the lower metal layer.

2. The semiconductor structure of claim 1, wherein the first insulating layer is formed using silane (SiH$_4$) or tetraethoxysilane (Si(OC$_2$H$_5$)$_4$, TEOS).

3. The semiconductor structure of claim 1, wherein the lower metal layer comprises titanium nitride (TiN) or tantalum nitride (TaN).

4. The semiconductor structure of claim 1, wherein the dielectric layer comprises high-k dielectric material.

5. The semiconductor structure of claim 4, wherein the high-k dielectric material comprises hafnium (Hf)-containing high-k material, zirconium (Zr)-containing high-k material, aluminum (Al)-containing high-k material, or any combination thereof.

6. The semiconductor structure of claim 1, wherein the upper metal layer comprises titanium (Ti), titanium nitride (TiN), tantalum (Ta), or tantalum nitride (TaN).

7. The semiconductor structure of claim 1, wherein the etch stop film further contacts a top surface of a potion of the lower metal layer, and wherein the portion of the lower metal layer extends beyond the dielectric layer and the upper metal layer.

8. The semiconductor structure of claim 1, wherein the etch stop film further contacts a top surface and a side surface of the upper metal layer and a side surface of the dielectric layer.

9. A semiconductor structure, comprising:
an opening in a surface of a first insulating layer; and
a capacitor including:
   a lower metal layer on the surface of the first insulating layer, and sidewalls and a bottom surface of the opening, wherein the sidewalls are tapered inwardly from the surface of the first insulating layer to the bottom surface of the opening by a taper angle of between 10 degrees and 45 degrees;
   a dielectric layer on the lower metal layer;
   an upper metal layer on the dielectric layer;
   an etch stop film on the upper metal layer and the lower metal layer, wherein the etch stop film contacts the upper metal layer and the lower metal layer;
a second insulating layer on the first insulating layer and the capacitor;
a first interconnect electrically connected to the upper metal layer through the second insulating layer,
a second interconnect electrically connected to the lower metal layer through the second insulating layer, and
a third interconnect electrically connected to a second metal interconnect layer underlying the first insulating layer through the second insulating layer.

10. A metal-insulator-metal (MIM) capacitor, comprising:
a lower metal layer continuously covering portions of a surface of a first insulating layer, sidewalls of a plurality of openings in the surface of the first insulating layer, and bottom surfaces of the plurality of openings;
a dielectric layer continuously covering the lower metal layer;
an upper metal layer continuously covering the dielectric layer; and a first etch stop film on the upper metal layer and the lower metal layer, wherein the first etch stop film contacts the upper metal layer and a top surface of a portion of the lower metal layer, wherein the portion of the lower metal layer extends beyond the dielectric layer and the upper metal layer,
wherein the plurality of openings is formed in a two-dimensional array in a first direction and in a second direction that is perpendicular to the first direction.

11. The MIM capacitor of claim 10, wherein
the sidewalls at edges of each of the plurality of openings in the first direction are tapered inwardly from the surface of the first insulating layer to the bottom surface of the opening in the first direction by a taper angle of between 10 degrees and 45 degrees, and
the sidewalls at edges of each of the plurality of openings in the second direction are tapered inwardly from the surface of the first insulating layer to the bottom surface of the opening in the second direction by a tapered angle of between 10 degrees and 45 degrees.

12. The MIM capacitor of claim 10, further comprising:
a second insulating layer on the upper metal layer and the lower metal layer.

13. A metal-insulator-metal (MIM) capacitor, comprising:
a lower metal layer continuously covering portions of a surface of a first insulating layer, sidewalls of a plurality of openings in the surface of the first insulating layer, and bottom surfaces of the plurality of openings;
a dielectric layer continuously covering the lower metal layer;
an upper metal layer continuously covering the dielectric layer;
a first etch stop film on the upper metal layer and the lower metal layer, wherein the first etch stop film contacts the upper metal layer and the lower metal layer;
a second insulating layer on the upper metal layer and the lower metal layer; and
a second etch stop film between the first insulating layer and an underlying insulating layer encapsulating a metal interconnect layer
wherein the plurality of openings is formed in a two-dimensional array in a first direction and in a second direction that is perpendicular to the first direction, and wherein the first etch stop film is between the second insulating layer and the upper metal layer and between the second insulating layer and the lower metal layer.

14. The MIM capacitor of claim 13, the first and second etch stop films comprise silicon carbide (SiC)-containing material.

15. The MIM capacitor of claim 13, further comprising:
a first interconnect extending through the second insulating layer to the first etch stop film;
a second interconnect extending through the second insulating layer to the lower metal layer; and
a third interconnect extending through the second insulating layer and the first insulating layer to the metal interconnect layer.

* * * * *